United States Patent
Li et al.

(10) Patent No.: US 10,497,762 B2
(45) Date of Patent: Dec. 3, 2019

(54) METHOD FOR MANUFACTURING FLEXIBLE DISPLAY DEVICE AND FLEXIBLE DISPLAY DEVICE

(71) Applicant: BOE TECHNOLOGY GROUP CO., LTD., Beijing (CN)

(72) Inventors: Hong Li, Beijing (CN); Baoming Cai, Beijing (CN); Weifeng Zhou, Beijing (CN); Shan-chen Kao, Beijing (CN)

(73) Assignee: BOE TECHNOLOGY GROUP CO., LTD, Beijing (CN)

( * ) Notice: Subject to any disclaimer, the term of this patent is extended or adjusted under 35 U.S.C. 154(b) by 0 days.

(21) Appl. No.: 15/845,689

(22) Filed: Dec. 18, 2017

(65) Prior Publication Data

US 2018/0315804 A1    Nov. 1, 2018

(30) Foreign Application Priority Data

Apr. 27, 2017    (CN) .......................... 2017 1 0288264

(51) Int. Cl.
*H01L 27/32* (2006.01)
*H01L 51/56* (2006.01)
*H01L 51/52* (2006.01)
*H01L 51/00* (2006.01)

(52) U.S. Cl.
CPC ...... *H01L 27/3244* (2013.01); *H01L 51/5237* (2013.01); *H01L 51/56* (2013.01); *H01L 51/0097* (2013.01); *H01L 2227/323* (2013.01); *H01L 2251/5338* (2013.01)

(58) Field of Classification Search
CPC ............. H01L 51/0097; H01L 27/3244; H01L 51/5237; H01L 51/56; H01L 2227/323; H01L 2251/5338
See application file for complete search history.

(56) References Cited

U.S. PATENT DOCUMENTS

2015/0036300 A1*    2/2015    Park ...................... H05K 1/147
361/749

FOREIGN PATENT DOCUMENTS

| CN | 104347678 A | 2/2015 |
| CN | 104835415 A | 8/2015 |
| CN | 105632344 A | 6/2016 |

(Continued)

OTHER PUBLICATIONS

First Office Action for CN Appl. No. 201710288264.5, dated Aug. 3, 2018.

*Primary Examiner* — Matthew L Reames
*Assistant Examiner* — Benjamin T Liu
(74) *Attorney, Agent, or Firm* — Foley & Lardner LLP; James F. Ewing; Paul M. H. Pua

(57) ABSTRACT

The disclosure provides a method for manufacturing a flexible display device and a flexible display device. The manufacturing method comprises: providing a bottom film to be treated, the bottom film being divided into a bezel bending area and a remaining area; surface treating the upper surface of the bottom film, such that an adhesive force between the bezel bending area and an adhesive layer to be laminated is less than an adhesive force between the remaining area and the adhesive layer to be laminated; providing a display panel to be laminated, and adhering the display panel to the upper surface of the bottom film via the adhesive layer; removing a portion of the bottom film that is located within the bezel bending area.

11 Claims, 3 Drawing Sheets

(56) References Cited

FOREIGN PATENT DOCUMENTS

| | | | |
|---|---|---|---|
| CN | 106205394 | A | 12/2016 |
| CN | 106816530 | * | 6/2017 |
| CN | 106816530 | A | 6/2017 |
| CN | 106910428 | A | 6/2017 |
| CN | 106910429 | A | 6/2017 |
| CN | 106910823 | A | 6/2017 |
| JP | 2011248621 | A | 12/2011 |

* cited by examiner

METHOD FOR MANUFACTURING FLEXIBLE DISPLAY DEVICE AND FLEXIBLE DISPLAY DEVICE

CROSS REFERENCE TO RELATED APPLICATION

This application claims priority to and the benefit of Chinese Patent Application No. 201710288264.5 filed on Apr. 27, 2017, the disclosure of which is incorporated herein in its entirety by reference.

TECHNICAL FIELD

The present invention relates to a method for manufacturing a flexible display device and a flexible display device.

BACKGROUND

Recently, a flexible Active Matrix Organic Light-Emitting Display (referred to as AMOLED for short) is more and more widely used.

SUMMARY

The embodiment of the disclosure adopts the following technical solutions:

On the one hand, the embodiment of the disclosure provides a method for manufacturing a flexible display device, the manufacturing method comprising: providing a bottom film to be treated, the bottom film being divided into a bezel bending area and a remaining area; surface treating the upper surface of the bottom film, such that an adhesive force between the bezel bending area and an adhesive layer to be laminated is less than an adhesive force between the remaining area and the adhesive layer to be laminated; providing a display panel to be laminated, and adhering the display panel to the upper surface of the bottom film via the adhesive layer; removing a portion of the bottom film that is located within the bezel bending area.

As an option, said surface treating the upper surface of the bottom film comprises: forming a first functional layer having hydrophilicity or hydrophobicity contrary to that of the adhesive layer to be laminated over the upper surface of the bottom film located within the bezel bending area.

As another option, said surface treating the upper surface of the bottom film comprises: forming a second functional layer having hydrophilicity or hydrophobicity identical with that of the adhesive layer to be laminated over the upper surface of the bottom film located within the remaining area.

As a further option, said surface treating the upper surface of the bottom film comprises: forming a first functional layer having hydrophilicity or hydrophobicity contrary to that of the adhesive layer to be laminated over the upper surface of the bottom film located within the bezel bending area; and forming a second functional layer having hydrophilicity or hydrophobicity identical with that of the adhesive layer to be laminated over the upper surface of the bottom film located within the remaining area.

Preferably, the adhesive layer to be laminated is hydrophilic; the step of forming a first functional layer having hydrophilicity or hydrophobicity contrary to that of the adhesive layer to be laminated over the upper surface of the bottom film located within the bezel bending area comprises: utilizing spray coating to form the first functional layer made of a hydrophobic material over the upper surface of the bottom film located within the bezel bending area through a hollow area of a mask; or utilizing a self-assembly method to form the first functional layer that is a monomolecular layer consisting of hydrophobic functional groups over the upper surface of the bottom film located within the bezel bending area.

Preferably, the adhesive layer to be laminated is hydrophobic; the step of forming a first functional layer having hydrophilicity or hydrophobicity contrary to that of the adhesive layer to be laminated over the upper surface of the bottom film located within the bezel bending area comprises: utilizing spray coating to form the first functional layer made of a hydrophilic material over the upper surface of the bottom film located within the bezel bending area through a hollow area of a mask; or utilizing a self-assembly method to form the first functional layer that is a monomolecular layer consisting of hydrophilic functional groups over the upper surface of the bottom film located within the bezel bending area.

Preferably, the adhesive layer to be laminated is hydrophilic; the step of forming a first functional layer having hydrophilicity or hydrophobicity identical with that of the adhesive layer to be laminated over the upper surface of the bottom film located within the remaining area comprises: utilizing spray coating to form the first functional layer made of a hydrophilic material over the upper surface of the bottom film located within the remaining area through a hollow area of a mask; or utilizing a self-assembly method to form the first functional layer that is a monomolecular layer consisting of hydrophilic functional groups over the upper surface of the bottom film located within the remaining area.

Preferably, the adhesive layer to be laminated is hydrophobic; the step of forming a first functional layer having hydrophilicity or hydrophobicity identical with that of the adhesive layer to be laminated over the upper surface of the bottom film located within the remaining area comprises: utilizing spray coating to form the first functional layer made of a hydrophobic material over the upper surface of the bottom film located within the remaining area through a hollow area of a mask; or utilizing a self-assembly method to form the first functional layer that is a monomolecular layer consisting of hydrophobic functional groups over the upper surface of the bottom film located within the remaining area.

Preferably, the formed first functional layer has a thickness less than 10 µm. Preferably, the formed second functional layer has a thickness less than 10 µm. Optionally, after the step of removing a portion of the bottom film that is located within the bezel bending area, the method further comprises: performing a modification treatment on a portion of the adhesive layer that is exposed from the bottom film, such that the portion of the adhesive layer corresponding to the bezel bending area has a reduced viscosity or loses its viscosity.

Optionally, after the step of removing a portion of the bottom film that is located within the bezel bending area, the method further comprises: contacting a portion of the adhesive layer that is exposed from the bottom film with a reaction liquid, such that the portion of the adhesive layer corresponding to the bezel bending area dissolves.

Optionally, the surface of the display panel that is away from the adhesive layer is coated with a Chip On Flex/Film (COF); the display device further comprises a flexible printed circuit board laminated through the COF; after the step of removing a portion of the bottom film that is located within the bezel bending area, the method further comprises: bending one end of the display panel laminated with the flexible printed circuit board through the COF towards the bottom film, such that the COF and the flexible printed circuit board are located on a side of the bottom film that is away from the adhesive layer.

On the other hand, the embodiment of the disclosure provides a flexible display device, comprising a display panel, the display panel being divided into a bezel bending area and a remaining area; the flexible display device further comprises: an adhesive layer; and a bottom film that is adhered to the display panel through the adhesive layer, wherein the bottom film is located only within the remaining area.

Preferably, the adhesive layer is located only between the display panel and the bottom film; or, a portion of the adhesive layer corresponding to the bezel bending area has no viscosity; or, a portion of the adhesive layer corresponding to the bezel bending area has a viscosity less than that of a remaining portion of the adhesive layer.

BRIEF DESCRIPTION OF THE DRAWINGS

In order to more clearly illustrate the embodiments of the disclosure or the technical solutions in the prior art, a brief introduction will be given below for the drawings required to be used in the description of the embodiments or the prior art. It is obvious that, the drawings illustrated as follows are merely some of the embodiments of the disclosure. For a person skilled in the art, he or she may also acquire other drawings according to such drawings on the premise that no inventive effort is involved.

DETAILED DESCRIPTION

Figure 1:
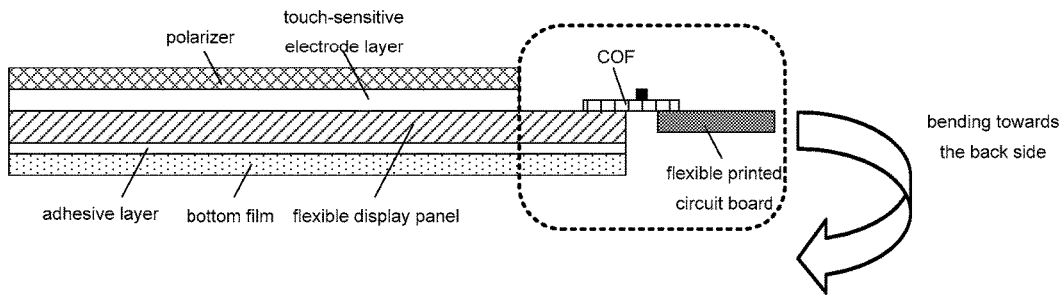
FIG. 1 is a schematic sectional view showing a laminated flexible display device provided by the prior art.

The technical solutions in the embodiments of the disclosure will be clearly and completely described below with the drawings of the embodiments of the disclosure. Obviously, the described embodiments are just a part of the embodiments of the disclosure instead of all of the embodiments. All other embodiments that are obtainable to those skilled in the art based on the embodiments of the disclosure without any inventive efforts are included in the protection scope of the disclosure.

It is to be pointed out that, unless otherwise defined, all the terms used in the embodiments of the disclosure (including technological and scientific terms) have meanings identical with those as commonly understood by those skilled in the field to which the disclosure pertains. It shall be further understood that, the terms as generally defined in a dictionary shall be interpreted as having meanings consistent with those in the context of the relevant technique, instead of being interpreted with an idealistic or extremely formalized meaning, unless it is explicitly defined here.

For example, the terms "first", "second" and similar wordings used in the description and claims of the present patent application do not mean any order, quantity or importance, but are used only to discriminate different constituents. A term such as "comprising" or "including" means the element or article appearing before said term contains the element or article appearing after said term and equivalents thereof, without exclusion of other elements or articles. The terms "one side", "the other side" and the like that indicate orientations or positional relations indicate orientations or positional relations as illustrated by the drawings, which are just simplified descriptions in order to facilitate demonstration of the technical solution of the disclosure, but do not indicate or suggest that the device or element referred to must have a specific orientation and be configured and operated based on the specific orientation, so said terms shall not be understood as limitations on the disclosure.

Furthermore, since the respective films of the flexible display device involved in the embodiments of the disclosure have a small thickness, for clarity, the dimensions of the respective structures in the drawings of the embodiments of the disclosure are amplified, which do not represent the actual dimension and ratio.

As shown in FIG. 1, the flexible Active Matrix Organic Light-Emitting Display (referred to as AMOLED for short) is generally made up of a polarizer (C-pol), a touch-sensitive electrode layer (Touch), a flexible display panel (Panel) and a bottom film for protecting the flexible display panel (Bottom Film), which are laminated in sequence. The flexible display panel is electrically connected at one end to a flexible printed circuit board (referred to as FPC for short) via a Chip On Flex/Film (referred to as COF for short).

At present, one end of the flexible display panel provided with the COF is generally bent towards the back side of the panel (as shown by the dotted line and arrow in the figure), such that the COF and the FPC are bent to the back side of the flexible display panel so as to further reduce the bezel of the AMOLED device, achieving an effect of narrow-bezel displaying.

However, the substrate of the flexible display panel is generally made up of a flexible PI (polyimide) substrate, and the flexible PI substrate and the bottom film will have uneven stress distribution in the bending area, which would result in a series of problems in the bending area. For example, since the COF and FPC cannot be completely bent to the back side of the flexible display panel, the effect of narrowing the bezel is worsened; and/or, due to the numerous flexible thin films in the bending area, more neighboring areas than previously set bending areas are forced to bend, such that metal wires such as the metal pad within an edge of the flexible display panel close to the bending area go broken, thereby reducing the display quality of the product.

In view of the above, in order to solve the existing technical problem, the embodiment of the disclosure provides a method for manufacturing a flexible display device and a flexible display device, which can decrease the extent of stress unevenness in a bending area when the flexible display device laminated by the manufacturing method is bent, which favors complete back bending of the circuit board, thereby achieving an effect of narrow bezel.

In the manufacturing method provided by the embodiment of the disclosure as mentioned above, before the bottom film is laminated with the display panel to be laminated, its upper surface is subjected to a surface treatment, such that an adhesive force between the bezel bending area and the adhesive layer to be laminated is less than an adhesive force between the remaining area and the adhesive layer to be laminated, so that it is easy to remove the portion of the bottom film that is located within the bezel bending area. In this case, when the laminated flexible display device is bent, since a portion of the bottom film that is located within the bezel bending area has been removed, the entire thickness of the film of the bending portion is decreased, thereby decreasing the extent of stress unevenness on this portion of the film, which favors complete back bending of the COF end of the display panel towards a side of the display panel that is away from the display, thereby achieving an effect of narrow bezel on the display device.

Figure 2:
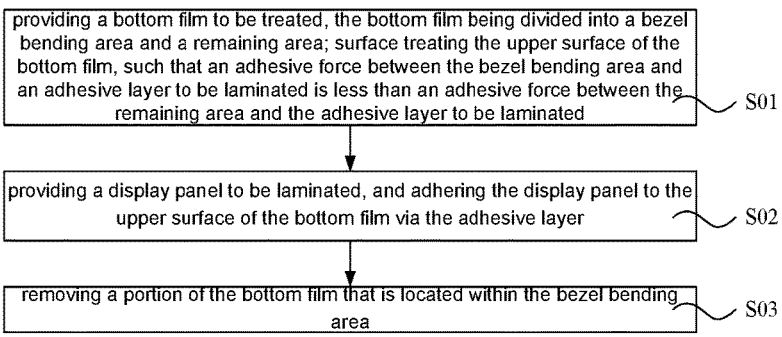
FIG. 2 is a flow chart showing a method for manufacturing a flexible display device provided by the embodiment of the disclosure.

As shown in FIG. 2, the embodiment of the disclosure provides a method for manufacturing a flexible display device, the manufacturing method comprising:

Step S01, providing a bottom film to be treated, the bottom film being divided into a bezel bending area and a remaining area; surface treating the upper surface of the bottom film, such that an adhesive force between the bezel bending area and an adhesive layer to be laminated is less than an adhesive force between the remaining area and the adhesive layer to be laminated;

Step S02, providing a display panel to be laminated, and adhering the display panel to the upper surface of the bottom film via the adhesive layer;

Step S03, removing a portion of the bottom film that is located within the bezel bending area.

It is to be noted that the upper surface of the bottom film refers to a surface close to the laminated side of the display panel to be laminated (i.e., a front face as generally called), and the opposite surface is the lower surface. As used here, the concepts of "upper" and "lower" are only to show the opposite positional relation between the two surfaces, but shall not limit the orientations of the two surfaces.

The so-called "surface treating" refers to a processing method of forming, on the surface of the substrate material, a surface layer having mechanical, physical and chemical properties different than the substrate. The purpose of the surface treating is to meet requirements on the product in terms of anti-corrosion, abrasion resistance, decoration or other special functions.

In the manufacturing method provided by the embodiment of the disclosure as mentioned above, the purpose of surface treating the upper surface of the bottom film is to make an adhesive force between the bezel bending area and the adhesive layer to be laminated less than an adhesive force between the remaining area and the adhesive layer to be laminated.

In said step S02, the specific manner of adhering the display panel to the upper surface of the bottom film via the adhesive layer may be firstly laminating the adhesive layer onto the display panel, and then adhering it to the bottom film; alternatively, the adhesive layer may be firstly laminated onto the bottom film, and then be adhered to the display panel. In consideration of the facts that the bottom film is a film material having a small thickness, it is difficult to laminate the adhesive layer thereon, and the lamination would result in a poor fit uniformity, while the display panel has a relatively great thickness, and the adhesive layer can be evenly laminated thereon, it is preferred that the adhesive layer is firstly laminated onto the display panel and then is laminated with the bottom film.

In said Step S03, said portion of the bottom film that is located within the bezel bending area may be removed by, for example, a physical method of cutting followed by peeling; of course, the other chemical methods may be used, as long as the portion of the bottom film that is located within the bezel bending area and has a small adhesive force with the adhesive layer can be removed.

Here, the surface of the display panel that is away from the adhesive layer is coated with a Chip On Flex/Film (COF); the flexible display device further comprises a flexible printed circuit board laminated through the COF; after completing said Step S03, the method further comprises a step of bending, i.e., bending one end of the display panel laminated with the flexible printed circuit board through the COF towards the bottom film, such that the COF and the flexible printed circuit board are located on a side of the bottom film that is away from the adhesive layer.

In view of the above, in the manufacturing method provided by the embodiment of the disclosure as mentioned above, before the bottom film is laminated with the display panel to be laminated, its upper surface is subjected to a surface treatment, such that an adhesive force between the bezel bending area and the adhesive layer to be laminated is less than an adhesive force between the remaining area and the adhesive layer to be laminated, so that it is easy to remove the portion of the bottom film that is located within the bezel bending area. In this case, when the laminated flexible display device is bent, since the portion of the bottom film that is located within the bezel bending area has been removed, the entire thickness of the film of the bending portion is decreased, thereby decreasing the extent of stress unevenness on this portion of the film, which favors complete back bending of the COF end of the display panel towards a side of the display panel that is away from the display, thereby achieving an effect of narrow bezel on the display device.

On this basis, in order to further decrease the extent of stress unevenness of the respective flexible material films in the bezel bending area upon bending, after completing said Step S03, the manufacturing method further comprises the following Step S04, which is, for example, Implementation I for Step S04: performing a modification treatment on a portion of the adhesive layer that is exposed from the bottom film, such that the portion of the adhesive layer corresponding to the bezel bending area has a reduced viscosity or loses its viscosity, thereby further decreasing the stress unevenness upon bending.

Here, the adhesive layer, for example, may be an OCA (Optically Clear Adhesive), which is a special adhesive for adhesion of a transparent optical element such as a display screen and is characterized by its high light penetration of greater than 90% and good adhesive strength.

Aside from main components for a primary adhesive material, the OCA may comprise a component such as a light initiator that is introduced as needed. The modification treatment on the OCA, for example, may be ultraviolet light radiation to cause a series of chemical reactions between the light initiator and the primary adhesive material, thereby reducing or eliminating viscosity of a portion of the OCA that has been subjected to the light radiation. The specific components in the material may follow the prior art, and the embodiment of the disclosure has no limits thereon.

Implementation II for Step S04: contacting a portion of the adhesive layer that is exposed from the bottom film with a reaction liquid, such that the portion of the adhesive layer corresponding to the bezel bending area dissolves, thereby further decreasing the stress unevenness upon bending.

Here, the OCA is still taken as an example. The reaction liquid is a reagent that can dissolve the primary adhesive material. By, for example, immersing the portion of the adhesive layer that is exposed from the bottom film into the reaction liquid, or surface spraying and scrubbing the reaction liquid onto the portion of the adhesive layer that is exposed from the bottom film, the portion of the adhesive layer that is exposed from the bottom film is contacted with a reaction liquid, such that this portion of adhesive layer is removed. The specific components of the OCA and the reaction liquid selected to dissolve the OCA may follow the prior art, and the embodiment of the disclosure have no limits thereon.

On the basis of the above, the embodiment of the disclosure provides the following two exemplary examples to describe the above-mentioned lamination process in details.

EXAMPLE 1

Figure 3:
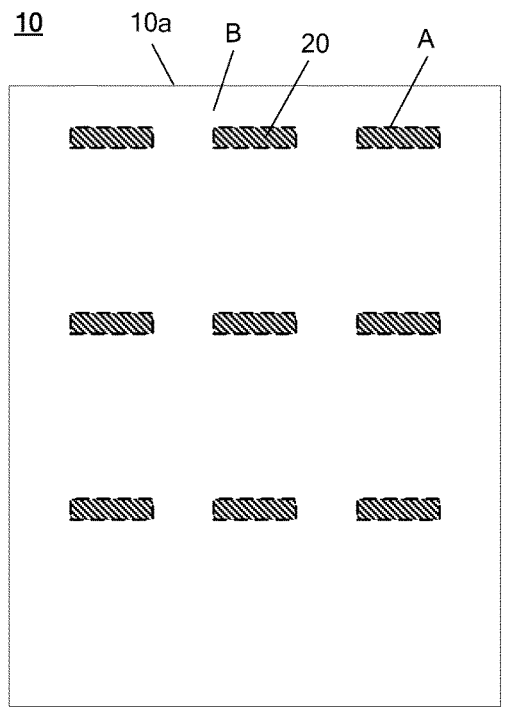
FIG. 3 is a stepwise schematic diagram I for an example embodiment of the disclosure.

Step S11, as shown in FIG. 3, providing a bottom film 10 to be treated, the bottom film 10 being divided into a bezel bending area (marked as A in the figure) and a remaining area (marked as B in the figure); forming a first functional layer 20 over the upper surface 10a of the bottom film 10 located within the bezel bending area, the first functional layer 20 having hydrophilicity/hydrophobicity contrary to that of the adhesive layer to be laminated, and the first functional layer 20 having a thickness less than 10 μm in order to avoid a mismatch due to an excessive thickness, which would affect adhesiveness between the upper surface 10a and the adhesive layer.

Figure 4:
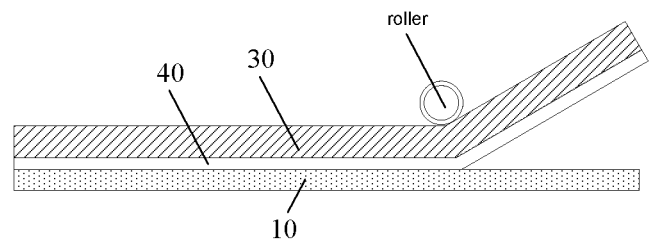
FIG. 4 is a stepwise schematic diagram II for the example embodiment of the disclosure.

Step S12, as shown in FIG. 4, providing a display panel 30 to be laminated, on one side of which an adhesive layer 40 is laminated; laminating the upper surface 10a with the adhesive layer 40 by rolling compaction with a roller.

Figure 5:
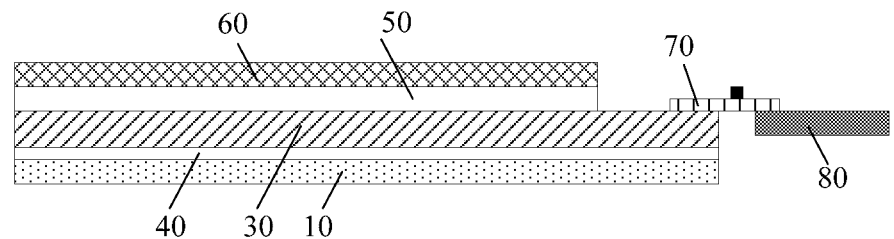
FIG. 5 is a stepwise schematic diagram III for the example embodiment of the disclosure.

Step S13, as shown in FIG. 5, further assembling the flexible module to laminate on the display panel 30 in sequence a touch-sensitive electrode layer 50, a polarizer 60, a COF 70 and a flexible printed circuit board 80 in electrical connection with the COF 70, wherein an area of the display panel 30 that is not covered by the touch-sensitive electrode layer 50 and the COF 70 corresponds to the bezel bending area of the bottom film 10.

Figure 6:
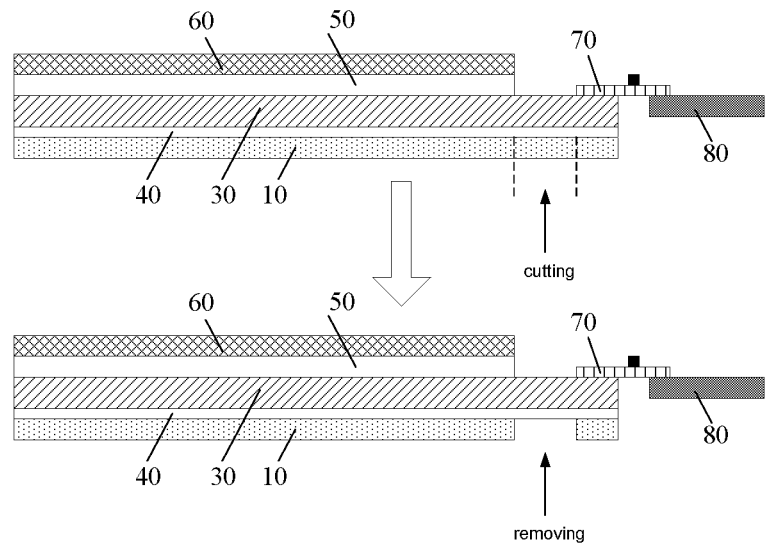
FIG. 6 is a stepwise schematic diagram IV for the example embodiment of the disclosure.

Step S14, as shown in FIG. 6, since the first functional layer (which is not shown in FIG. 6 due to its small thickness) formed over the upper surface 10a of the bottom film 10 located within the bezel bending area has hydrophilicity or hydrophobicity contrary to that of the laminated adhesive layer 40, an adhesive force between the bezel bending area and the adhesive layer 40 is less than an adhesive force between the remaining area and the adhesive layer 40. The bottom film 10 in this area is cut and removed so as to expose the portion of the adhesive layer 40 that is located within the bezel bending area.

Figure 7:
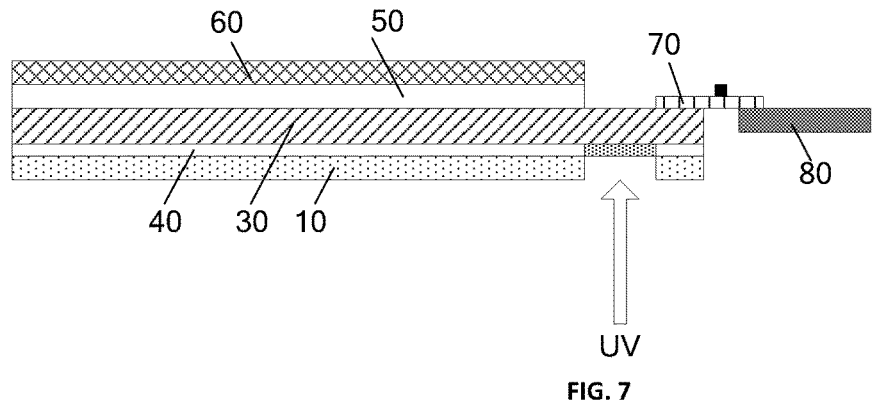
FIG. 7 is a stepwise schematic diagram V for the example embodiment of the disclosure.

Step S15, as shown in FIG. 7, radiating the exposed portion of the adhesive layer 40 by ultraviolet (referred to as UV for short) to cause this portion of adhesive layer 40 to lose its viscosity.

Figure 8:
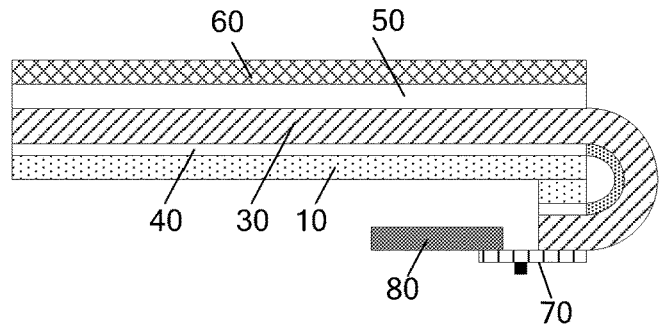
FIG. 8 is a stepwise schematic diagram VI for the example embodiment of the disclosure.

Step S16, as shown in FIG. 8, bending the COF end of the display panel 30. Since only PI & OCA, i.e., the PI substrate of the display panel 30 and the portion of the adhesive layer 40 that has lost its viscosity, exist in the bending area, the COF 70 and the flexible printed circuit board 80 can be completely back bent to the back side of the display panel 30, thereby achieving an effect of narrow bezel.

It is to be noted that, firstly, FIG. 3 shows a bottom film motherboard comprising a plurality of small blocks of bottom films 10 to be divided (the motherboard corresponds to a panel motherboard comprising a plurality of small blocks of display panels) as an example, and said bottom film 10 may be also a small-block bottom film corresponding to a single display panel. The embodiment of the disclosure has no limits thereon.

Secondly, the so-called "hydrophilicity/hydrophobicity" (sometimes referred to herein as "hydrophilicity or hydrophobicity", is a general term referring to hydrophilicity and hydrophobicity, wherein hydrophilicity generally characterizes a performance of a material on affinity to a polar liquid such as water; in contrast, hydrophobicity characterizes a performance of a material on repulsion to a polar liquid such as water.

In said Step S11, that the first functional layer 20 has hydrophilicity/hydrophobicity contrary to that of the adhesive layer to be laminated means that if the adhesive layer to be laminated is hydrophilic, the first functional layer 20 is hydrophobic, and vice versa. Since the first functional layer 20 has hydrophilicity/hydrophobicity contrary to that of the adhesive layer to be laminated, the first functional layer 20 is a material having a low surface energy with respect to the adhesive layer, and it is not easy for the adhesive layer to diffuse on it, so that there is little adhesiveness with it, thereby facilitating the cutting and removing in the following step S14.

Here, for example, the adhesive layer 40 to be laminated is hydrophilic, it is possible to utilize spray coating to form a first functional layer 20 made of a hydrophobic material over the upper surface 10a of the bottom film 10 located within the bezel bending area through a hollow area of a mask, the first functional layer 20 having a thickness less than 10 μm. That is, the bezel bending area is exposed by the mask and aligned therewith to avoid spray coating of the hydrophobic material onto the remaining area.

Alternatively, it is also possible to utilize a self-assembly method to form a first functional layer 20 over the upper surface 10a of the bottom film 10 located within the bezel bending area, the first functional layer 20 is a monomolecular layer consisting of hydrophobic functional groups, wherein the thickness of the monomolecular layer is of molecular order, which is very small, and the bending area has a small area, so it would not cause a mismatch and would not impose any unfavorable effect on the lamination of the OCA.

In a case where the adhesive layer 40 to be laminated is hydrophobic, i.e., correspondingly, the first functional layer is hydrophilic, the first functional layer may be formed by utilizing said spray coating or self-assembly method. The specific processing is as described above, which would not be repeated in the exemplary example.

The so-called "self-assembly" refers to a technique of spontaneously forming an ordered structure over a substrate (i.e., the upper surface of the bottom film in the embodiment of the disclosure) from basic structural units (such as molecules, nanomaterials, substances of micron or larger dimensions).

Here, the hydrophobic functional groups/hydrophobic materials may be selected from lipoids, mold-release agents, OTS (octadecyltrichlorosilane), carbon nanotube film superhydrophobic materials in an array of columnar structures and the like. The specific material as used may follow the prior art, which would not be repeated in the embodiment of the disclosure.

EXAMPLE 2

Figure 9:
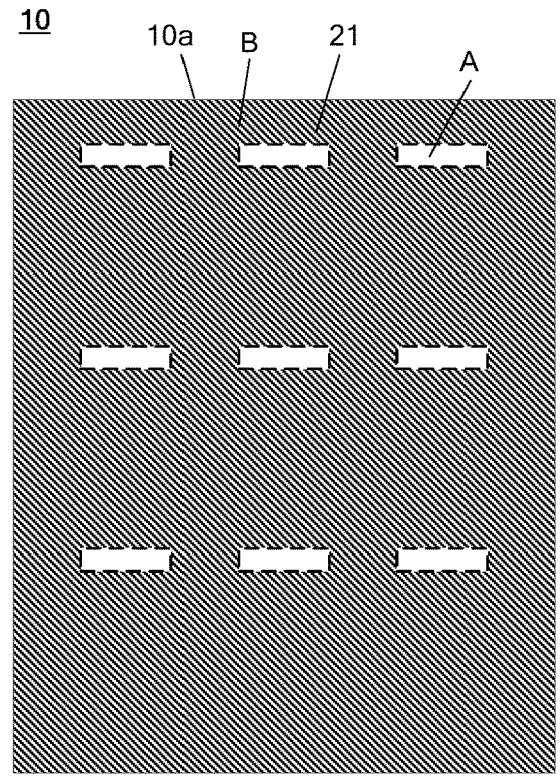
FIG. 9 is a stepwise schematic diagram for an example embodiment of the disclosure.

Step S21, as shown in FIG. 9, providing a bottom film 10 to be treated, the bottom film 10 being divided into a bezel bending area (marked as A in the figure) and a remaining area (marked as B in the figure); forming a second functional layer 21 over the upper surface 10a of the bottom film 10 located within a remaining area other than the bezel bending area, the second functional layer 21 having hydrophilicity/hydrophobicity identical with that of the adhesive layer to be laminated, and the second functional layer 21 having a thickness less than 10 µm in order to avoid a mismatch due to an excessive thickness, which would affect adhesiveness between the upper surface 10a and the adhesive layer.

Step S22, as shown in FIG. 4, providing a display panel 30 to be laminated, on one side of which an adhesive layer 40 is laminated; laminating the upper surface 10a with the adhesive layer 40 by rolling compaction with a roller.

Step S23, as shown in FIG. 5, further assembling the flexible module to laminate on the display panel 30 in sequence a touch-sensitive electrode layer 50, a polarizer 60, a COF 70 and a flexible printed circuit board 80 in electrical connection with the COF 70, wherein an area of the display panel 30 that is not covered by the touch-sensitive electrode layer 50 and the COF 70 corresponds to the bezel bending area of the bottom film 10.

Step S24, as shown in FIG. 6, since the second functional layer (which is not shown in FIG. 6 due to its small thickness) formed over the upper surface 10a of the bottom film 10 located within the remaining area other than the bezel bending area has hydrophilicity/hydrophobicity identical with that of the laminated adhesive layer 40, and the OCA is highly matched with a material having the same hydrophilicity/hydrophobicity, an adhesive force between the remaining area and the adhesive layer 40 is greater than an adhesive force between the bezel bending area and the adhesive layer 40. The bottom film 10 in the bezel bending area is cut and removed so as to expose the portion of the adhesive layer 40 that is located within the bezel bending area.

Step S25, as shown in FIG. 7, radiating the exposed portion of the adhesive layer 40 by UV to cause this portion of adhesive layer 40 to lose its viscosity.

Step S26, as shown in FIG. 8, bending the COF end of the display panel 30. Since only PI & OCA, i.e., the PI substrate of the display panel 30 and the portion of the adhesive layer 40 that has lost its viscosity, exist in the bending area, the COF 70 and the flexible printed circuit board 80 can be completely back bent to the back side of the display panel 30, thereby achieving an effect of narrow bezel.

It is to be noted that, firstly, FIG. 9 shows a bottom film motherboard comprising a plurality of small blocks of bottom films 10 to be divided (the motherboard corresponds to a panel motherboard comprising a plurality of small blocks of display panels) as an example, and said bottom film 10 may be also a small-block bottom film corresponding to a single display panel. The embodiment of the disclosure has no limits thereon.

Secondly, in said Step S21, that the second functional layer 21 has hydrophilicity/hydrophobicity identical with that of the adhesive layer to be laminated means that if the adhesive layer to be laminated is hydrophilic, the second functional layer 21 is also hydrophilic, and vice versa. The second functional layer 21 is a material having a high surface energy with respect to the adhesive layer, such that it is easy for the adhesive layer to diffuse on it. The interaction therebetween is similar to an AB adhesive (an AB adhesive is an alternative name of a two-liquid mixed hardening adhesive, in which one liquid is the body adhesive, i.e., adhesive A, and the other liquid is a hardener, i.e., adhesive B), wherein the hydrophilic second functional layer 21 corresponds to adhesive A, and the OCA of the adhesive layer corresponds to adhesive B, which facilitates the cutting and removing in the following step S24.

Here, for example, the adhesive layer 40 to be laminated is hydrophilic, it is possible to utilize spray coating to form a second functional layer 21 made of a hydrophilic material over the upper surface 10a of the bottom film 10 located within the remaining area other than bezel bending area through a hollow area of a mask, the second functional layer 21 having a thickness less than 10 µm. That is, the bezel bending area is blocked by the mask and aligned therewith to avoid spray coating of the hydrophilic material onto the bezel bending area.

Alternatively, it is also possible to utilize a self-assembly method to form a second functional layer 21 over the upper surface 10a of the bottom film 10 located within the remaining area other than the bezel bending area, the second functional layer 21 being a monomolecular layer consisting of hydrophilic functional groups, wherein the thickness of the monomolecular layer is of molecular order, which is very small, and the bending area has a small area, so it would not cause a mismatch and would not impose any unfavorable effect on the lamination of the OCA.

In a case where the adhesive layer 40 to be laminated is hydrophobic, i.e., correspondingly, the first functional layer is hydrophilic, the first functional layer may be formed by utilizing said spray coating or self-assembly method. The specific processing is as described above, which would not be repeated in the exemplary example.

The so-called "self-assembly" refers to a technique of spontaneously forming an ordered structure over a substrate (i.e., the upper surface of the bottom film in the embodiment of the disclosure) from basic structural units (such as molecules, nanomaterials, substances of micron or larger dimensions).

Here, the hydrophilic functional groups/hydrophilic materials can improve the surface tension of the adhesive layer thereon, which may be, for example, surface treating agents, carbon nanotube film superhydrophilic materials and the like. The specific material may follow the prior art, and the embodiment of the disclosure would not repeat it here.

Further, a method combining said Example 1 with said Example 2 may be used. That is, forming a first functional layer 20 over the upper surface 10a of the bottom film 10 located within the bezel bending area, the first functional layer 21 having hydrophilicity/hydrophobicity contrary to that of the adhesive layer 40 to be laminated, and further forming a second functional layer 21 over the upper surface 10a of the bottom film 10 located within the remaining area, the second functional layer 21 having hydrophilicity/hydrophobicity identical with that of the adhesive layer 40 to be laminated.

The first functional 20 and the second functional layer 21 may be formed in a sequential process, i.e., one of them is formed firstly, and then the other is formed; alternatively, the two functional layers may be simultaneously formed by adjusting the specific processing steps of the spray coating or self-assembly method, which is not limited in the embodiment of the disclosure. The specific processing steps may follow the steps of Example 1 and Example 2 as mentioned above, which would not be repeated here in the embodiment of the disclosure.

On this basis, the embodiment of the disclosure further provides a flexible display device, which is formed by laminating and assembling according to the above-mentioned manufacturing method.

The flexible display device comprises a display panel, the display panel being divided into a bezel bending area and a remaining area; the flexible display device further comprises: an adhesive layer; and a bottom film that is adhered to the display panel through the adhesive layer, wherein the bottom film is located only within the remaining area.

It is easy to remove the portion of the bottom film that is located within the bezel bending area. When the laminated flexible display device is bent, since a portion of the bottom film that is located within the bezel bending area has been removed, the entire thickness of the film of the bending portion is decreased, thereby decreasing the extent of stress unevenness on this portion of the film.

On this basis, in order to further decrease the extent of stress unevenness of the respective flexible material films in the bezel bending area upon bending, said adhesive layer is further set by (including but being not limited to) the following manners:

I, the adhesive layer is located only between the display panel and the bottom film. For example, contacting a portion of the adhesive layer that is exposed from the bottom film with a reaction liquid, such that the portion of the adhesive layer located within the bezel bending area dissolves, thereby further decreasing the stress unevenness upon bending.

II, a portion of the adhesive layer corresponding to the bezel bending area has no viscosity; or, a portion of the adhesive layer corresponding to the bezel bending area has a viscosity less than that of the remaining portion of the adhesive layer, thereby further decreasing the stress unevenness upon bending.

Said flexible display device may be any product or part having a display function, such as an OLED display, an OLED television, a digital photo frame, a mobile phone, a tablet computer, and a navigator.

The above are only embodiments of the disclosure, but the protection scope of the disclosure shall not be limited thereto. Any modification or substitution conceivable to those familiar with the present technical field within the technical scope revealed by the disclosure shall be included in the protection scope of the disclosure. Therefore, the protection scope of the disclosure shall be dependent on the protection scope of the claims.

What is claimed is:

1. A method for manufacturing a flexible display device, the method comprising:
   providing a bottom film to be treated, the bottom film being divided into a bezel bending area and a remaining area; surface treating an upper surface of the bottom film, such that an adhesive force between the bezel bending area and an adhesive layer to be laminated is less than an adhesive force between the remaining area and the adhesive layer to be laminated;
   providing a display panel to be laminated, and adhering the display panel to the upper surface of the bottom film via the adhesive layer;
   removing a portion of the bottom film that is located within the bezel bending area; and
   performing a modification treatment on a portion of the adhesive layer that is exposed from the bottom film, such that the portion of the adhesive layer corresponding to the bezel bending area has a reduced viscosity or loses its viscosity; or contacting a portion of the adhesive layer that is exposed from the bottom film with a reaction liquid, such that the portion of the adhesive layer corresponding to the bezel bending area dissolves.

2. The method according to claim 1, wherein said surface treating the upper surface of the bottom film comprises:
   forming a first functional layer having hydrophilicity or hydrophobicity contrary to that of the adhesive layer to be laminated over the upper surface of the bottom film located within the bezel bending area.

3. The method according to claim 2, wherein the adhesive layer to be laminated is hydrophilic;
   the step of forming a first functional layer having hydrophilicity or hydrophobicity contrary to that of the adhesive layer to be laminated over the upper surface of the bottom film located within the bezel bending area comprises:
   utilizing spray coating to form the first functional layer made of a hydrophobic material over the upper surface of the bottom film located within the bezel bending area through a hollow area of a mask; or
   utilizing a self-assembly method to form the first functional layer that is a monomolecular layer consisting of hydrophobic functional groups over the upper surface of the bottom film located within the bezel bending area.

4. The method according to claim 2, wherein the adhesive layer to be laminated is hydrophobic;
   the step of forming a first functional layer having hydrophilicity or hydrophobicity contrary to that of the adhesive layer to be laminated over the upper surface of the bottom film located within the bezel bending area comprises:
   utilizing spray coating to form a first functional layer made of a hydrophilic material over the upper surface of the bottom film located within the bezel bending area through a hollow area of a mask; or
   utilizing a self-assembly method to form the first functional layer that is a monomolecular layer consisting of hydrophilic functional groups over the upper surface of the bottom film located within the bezel bending area.

5. The method according to claim 2, wherein the formed first functional layer has a thickness less than 10 µm.

6. The method according to claim 1, wherein said surface treating the upper surface of the bottom film comprises:
   forming a second functional layer having hydrophilicity or hydrophobicity identical with that of the adhesive layer to be laminated over the upper surface of the bottom film located within the remaining area.

7. The method according to claim 6, wherein the adhesive layer to be laminated is hydrophilic;
   the step of forming a second functional layer having hydrophilicity or hydrophobicity identical with that of the adhesive layer to be laminated over the upper surface of the bottom film located within the remaining area comprises:
   utilizing spray coating to form the second functional layer made of a hydrophilic material over the upper surface of the bottom film located within the remaining area through a hollow area of a mask; or
   utilizing a self-assembly method to form the second functional layer that is a monomolecular layer consisting of hydrophilic functional groups over the upper surface of the bottom film located within the remaining area.

8. The method according to claim 6, wherein the adhesive layer to be laminated is hydrophobic;
   the step of forming a second functional layer having hydrophilicity or hydrophobicity identical with that of the adhesive layer to be laminated over the upper surface of the bottom film located within the remaining area comprises:

utilizing spray coating to form the second functional layer made of a hydrophobic material over the upper surface of the bottom film located within the remaining area through a hollow area of a mask; or utilizing a self-assembly method to form the second functional layer that is a monomolecular layer consisting of hydrophobic functional groups over the upper surface of the bottom film located within the remaining area.

9. The method according to claim 6, wherein the formed second functional layer has a thickness less than 10 μm.

10. The method according to claim 1, wherein said surface treating the upper surface of the bottom film comprises:

forming a first functional layer having hydrophilicity or hydrophobicity contrary to that of the adhesive layer to be laminated over the upper surface of the bottom film located within the bezel bending area; and forming a second functional layer having hydrophilicity or hydrophobicity identical with that of the adhesive layer to be laminated over the upper surface of the bottom film located within the remaining area.

11. The method according to claim 1, wherein the surface of the display panel that is away from the adhesive layer is coated with a Chip On Flex/Film (COF); the flexible display device further comprises a flexible printed circuit board laminated through the COF;

after the step of removing a portion of the bottom film that is located within the bezel bending area, the method further comprises:

bending one end of the display panel laminated with the flexible printed circuit board through the COF towards the bottom film, such that the COF and the flexible printed circuit board are located on a side of the bottom film that is away from the adhesive layer.

* * * * *